United States Patent [19]

Koshkin et al.

[11] Patent Number: 5,471,179
[45] Date of Patent: Nov. 28, 1995

[54] SURFACE ACOUSTIC WAVE BANDPASS FILTER INCLUDING UNIQUE V-SHAPED ELECTRODE AND PHASE COMPENSATOR

[75] Inventors: Petr K. Koshkin; Jury M. Bobrovskikh; Alexander A. Sveshnikov, all of Voronezh, Russian Federation

[73] Assignee: Opytny Zavod Mikroelektroniki "RIF", Voronezn, Russian Federation

[21] Appl. No.: 360,173

[22] Filed: Dec. 20, 1994

Related U.S. Application Data

[63] Continuation of Ser. No. 74,844, filed as PCT/RU92/00184, Oct. 9, 1992, abandoned.

[30] Foreign Application Priority Data

Oct. 17, 1991 [RU] Russian Federation ........... 5005974

[51] Int. Cl.⁶ .................................................. H03H 9/64
[52] U.S. Cl. ............................. 333/195; 310/313 C
[58] Field of Search ........................... 333/193–196; 310/313 R, 313 B, 313 C, 313 D

[56] References Cited

U.S. PATENT DOCUMENTS

| | | | |
|---|---|---|---|
| 4,139,791 | 2/1979 | Yamada et al. | 310/313 C |
| 4,333,065 | 6/1982 | DeVries | 333/194 |
| 4,420,728 | 12/1983 | Bower | 333/196 |
| 4,438,417 | 3/1984 | Yamashita | 333/193 |
| 4,463,327 | 7/1984 | Suzuki | 333/194 |
| 4,516,095 | 5/1985 | Lee | 333/196 |
| 4,604,595 | 6/1986 | Kadota | 333/196 |
| 4,672,338 | 6/1987 | Faber | 333/194 |
| 4,912,356 | 3/1990 | Mariani et al. | 333/195 |

FOREIGN PATENT DOCUMENTS

| | | |
|---|---|---|
| 0074252 | 3/1983 | European Pat. Off. . |
| 0065917 | 4/1982 | Japan . |
| 4117016 | 4/1992 | Japan . |

OTHER PUBLICATIONS

Rechitsky, V. I. "Acoustoelectronic Radio Components Circuits, Topology Design" 1987, pp. 36–37.

Vigil, A. J. et al. "A Study of the Effects of Apodized . . . " 1987 Electronics.

Symposium, 1987 IEEE pp. 139–140.

*Primary Examiner*—Robert J. Pascal
*Assistant Examiner*—Darius Gambino
*Attorney, Agent, or Firm*—Ladas & Parry

[57] ABSTRACT

A surface acoustic wave bandpass filter has a piezoelectric substrate for propagation of electroacoustic waves, an input apodized electroacoustic transducer on a surface of the substrate having a tilted apodization structure, an output unapodized electroacoustic transducer spaced from said apodized transducer on the substrate surface and a phase compensator and a shield, which are metal film areas disposed on the surface of the substrate between the apodized and unapodized transducers. The apodized transducer has first and second V-shaped summing bus bars each consisting of a first part arranged in parallel to the direction of propagation of acoustic waves and a second part aligned at an angle $\Psi$ with respect to the first part, the second bus bar being disposed symmetricaly to the first bus bar relative to the tilted apodization structure.

1 Claim, 1 Drawing Sheet

SURFACE ACOUSTIC WAVE BANDPASS FILTER INCLUDING UNIQUE V-SHAPED ELECTRODE AND PHASE COMPENSATOR

This is a continuation of application(s) Ser. No. 08/074,844 filed on Jun. 9, 1993, now abandoned and International Application PCT/RU92/00184 filed on Oct. 9, 1992 and which designated the U.S.

BACKGROUND OF THE INVENTION

The present invention related generally to electronic engineering and, more particularly, to a surface-acoustic-wave (SAW) bandpass filter.

Known in the art is a SAW bandpass filter having a piezoelectric substrate with input and output electroacoustic transducers in series on its surface. At least one of the transducers is apodized, and a shield, which is actually a strip of metal film, is located between the transducers (U.S. Pat. No. 4,438,417).

In this prior art filter the apodization boundaries of the apodized transducer are symmetric about the longitudinal axis of the transducer, which is parallel to the propagation direction of the surface acoustic waves. Sum bus bars, which are strips of metal film respectively connected with a plurality of electrode fingers, are also aligned in parallel to the longitudinal axis of the transducer.

This embodiment of an apodized transducer has large inoperative areas of electrode surfaces (from apodization boundaries to sum bus bars), which produce a high level of SAW reflection, resulting, in its turn, in distortion of the transducer impulse response and, eventually, in shape distortion of the filter amplitude—frequency response over its transmission band frequency range.

Also known in the art is a SAW bandpass filter having a piezoelectric substrate with, in series on its surface, an input apodized electroacoustic transducer with sum bus bars connected to filter input terminals, a shield and an output non-apodized acoustoelectrical transducer with sum bus bars connected to filter output terminals (V. I. Rechitsky "Acoustoelectronic Radio Components", Radio i Sviaz, Moscow, 1987, p.p. 36, 37, FIG. 1.22).

Apodization boundaries of the apodized transducer in this prior art filter, as in the first above-mentioned filter, are located symmetrically about the longitudinal axis of the transducer, which is parallel to the propagation direction of the surface acoustic waves. However, the sum bus bars in this transducer are inclined and the space between the apodization boundary and the sum bus bars is filled with a conductive coating material. As a result, the layout of the side of the conductive coating material on the side of the apodized transducer facing the non-apodized transducer can provide a condition ensuring minimum distortions along the SAW front.

In designing this layout, different speed values of the SAW propagation should be taken into account along three specific zones or areas, such as a zone of overlapping electrode fingers connected to the opposite sum bus bars, a zone of the conductive coating (e.g., metallization) material and a free-surface zone of the piezoelectric substrate. To ensure the equality of the relative phase incursions of the surface acoustic waves during the SAW propagation from the overlapping-electrode-finger zone (apodization boundary) to the transducer boundary, the following conditions should be met: the phase incursion of the wave propagating in the overlapping-electrode-finger zone should be equal to the sum of the wave phase incursions in the conductive-coating zone and the free-surface zone.

In this embodiment of an apodized transducer, due to the reduction of the inoperative zones, the level of SAW reflection from them and, accordingly, the distortions of the transducer impulse response resulting from these reflections have been decreased.

However, the embodiment still has a high level of SAW reflection from the overlapping-electrode-finger zone due to a long length of signal passage (equal to the length of a transducer) in the overlapping-electrode-finger zone. Because the apodization axis is aligned with the axis of symmetry of the apodized transducer, the level of signal distortion from SAW reflection from the overlapping-electrode-finger zone changes along the wave propagation front, i.e. diminishes in the directions from the longitudinal axis of the transducer towards its periphery. This degrades the quality characteristics of the SAW filter.

Also known in the art is an interdigital electroacoustic transducer with a sloping structure of apodization, i.e., in which the boundaries of the apodization are symmetric about a line passing across the transducer diagonally. In this embodiment, the path of signal passage in the overlapping-electrode-finger zone has been considerably reduced, which decreases the level of SAW reflection (A. J. Vigil et. al. "A Study of the Effects of Apodized Structure Geometries on SAW Filter Parameters", Proceedings of the 1987 Lithium IEEE Ultrasonic Symposium, p. 139, 140, FIG. 2).

However, the use of a transducer with a sloping structure of apodization in a SAW filter is hindered by the following factors. First, the availability of large areas of inoperative electrodes results in a high level of SAW reflection accompanied by initiation of side components of the SAW filter frequency response and, thus, degraded quality characteristics. Second, polarization dependence results, i.e. the level of the direct-passage signal depends on the polarity of the apodized transducer connection. The latter is caused by a considerable difference in the length of the finger electrodes connected with sum bus bars of the different polarities.

SUMMARY OF THE INVENTION

It is an object of the invention to design a surface-acoustic-wave (SAW) bandpass filter with an apodized transducer with as little inoperative area as possible, a low level of SAW reflection from operative areas and, upon reversal of the polarity of the filter connections, practically identical single-pass or direct-passage signal levels.

The above object is accomplished with a surface-acoustic-wave (SAW) bandpass filter having a piezoelectric substrate and, disposed in series on its surface, an input apodized electroacoustic transducer with a sloping structure of apodization the sum bus bars of which are connected to filter input terminals, a screen and an output non-apodized acoustoelectrical transducer the sum bus bars of which are connected to filter output terminals. The input apodized transducer sum bus bars are V-shaped, whereby each consists of two parts, one part in parallel with the propagation direction of the surface acoustic waves, and the second part at an angle Ψ relative to the first part, so that the sum bus bars as much as possible approximate the boundaries of the transducer apodization. Moreover, the filter is provided with a phase compensator, which is an additional part of metallization disposed between the apodized transducer and the shield. It has a triangular shape oriented in such a way that its bases is in line with the sum bus bar part that is parallel to the propagation direction of the surface acoustic waves but is closer to the bent part of the same sum bus bar. The length values of base "a" and height "b" of the triangle are chosen to satisfy the following equations:

$$a=L/4-d,$$

$$b=(L/2-d)tg\ \Psi,$$

where L is the length of the apodized transducer, and d is the projection of a width d' of the bent port of the sum bus bar on the propagation direction of the surface acoustic waves.

A surface-acoustic-wave bandpass filter according to the present invention, due to V-shaped sum bus bars, has an inoperative area of the electrodes. Owing to the same circumstances, when also employing an input apodized transducer with a sloping structure of apodization in the bandpass filter, it is possible to reverse the filter polarity without the considerable variation in the direct-passage signal level of a normal or opposite connection.

BRIEF DESCRIPTION OF THE DRAWINGS

Hereinafter a specific but only preferred embodiment of the invention will be described in detail with reference to the accompanying drawings illustrating the specific embodiment, in which.

DESCRIPTION OF THE PREFERRED EMBODIMENT

Figure 1:
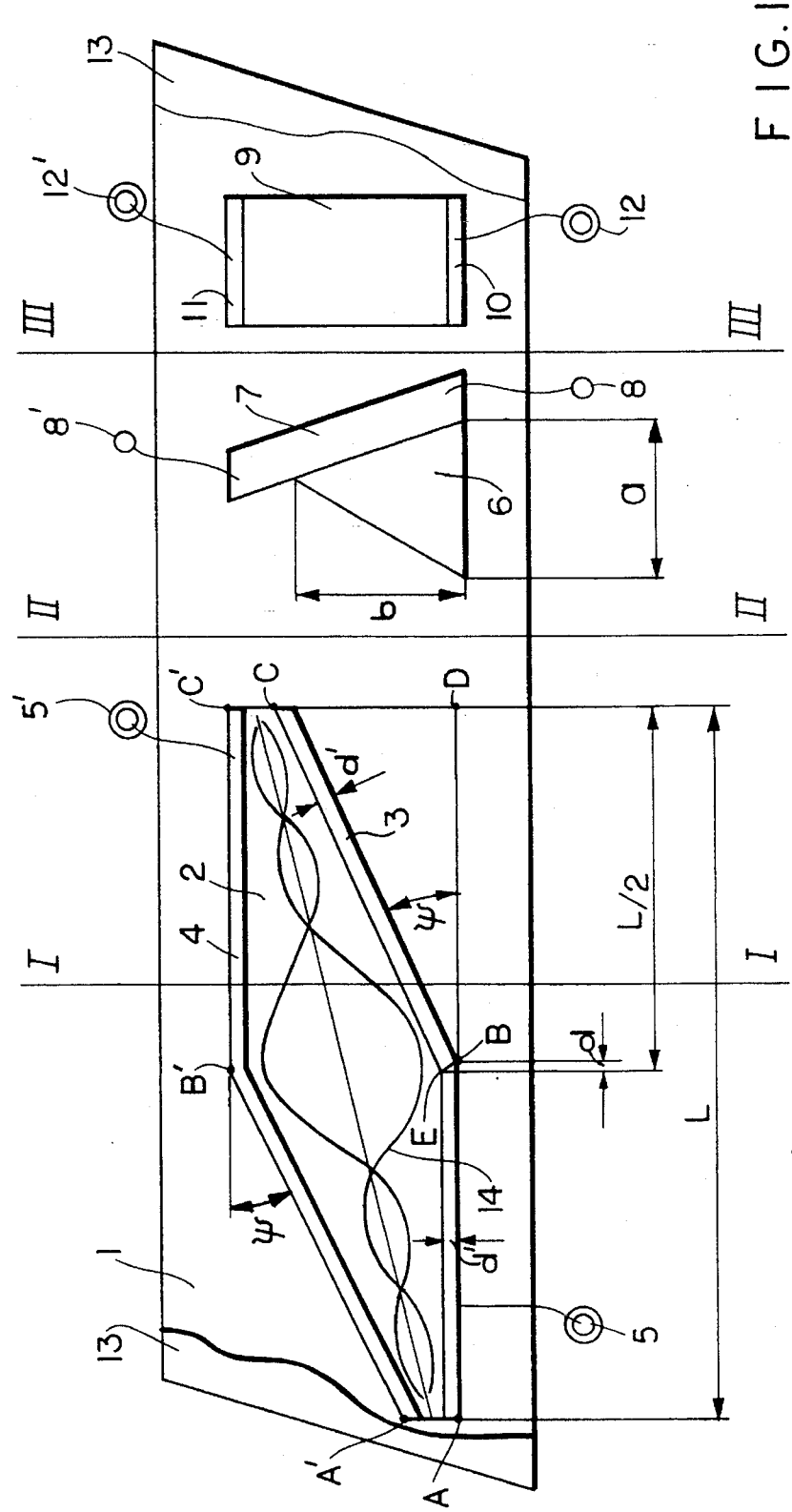
FIG. 1 shows a surface-acoustic-wave bandpass filter according to the invention, top view.

A SAW bandpass filter, as shown in FIG. 1 has a piezoelectric substrate 1 (for example, made of lithium niobate). Disposed in series on its surface are an input apodized electroacoustic transducer 2 with sum bus bars 3, 4 connected to the filter input terminals 5, 5', a phase compensator 6, a screen 7 connected to leads 8, 8' and an output non-apodized acoustoelectrical transducer 9 with sum bus bars 10, 11 connected to the filter output terminals 12, 12'. To decrease the level of signals reflected from the end faces of substrate 1, absorbing coating 13 is applied to the surface of the substrate adjacent to its end faces.

Figure 2:
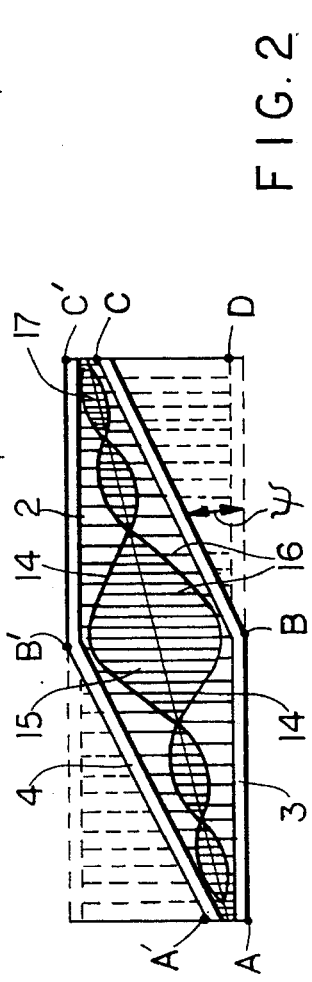
FIG. 2 gives a schematic representation of an apodized transducer according to the invention as shown in FIG. 1.

As shown in FIGS. 1 and 2, the input apodized transducer 2 has a sloping structure of apodization and, as shown particularly in FIG. 2, boundaries 14 of the zone or area 15 of overlapped finger electrodes 16 are symmetric about the axis line 17 of the sloping apodization structure, which is diagonal of transducer 2.

Sum bus bars 3, 4 (FIGS. 1 and 2) of transducer 2 are V-shaped, whereby each consists of two parts, i.e. part AB-BC having a width d' and part A'B'-B'C', respectively. Parts AB and B'C' are parallel to the propagation direction of the surface acoustic waves, and parts A'B' and BC are bent in relation to the parts AB and B'C', respectively, at an angle of $\Psi$ which is chosen to comply with a condition of maximum close approach of the sum bus bars 3, 4 to the apodization boundary 14 of the transducer 2.

The screen 7 is a strip of metal film which is inclined with respect to the propagation direction of the surface acoustic waves. The phase compensator 6 is also a metal film applied to the surface of the substrate 1 in the shape of an acute-angled triangle. The length values of the base "a" and height "b" of this triangle in the propagation direction of the surface acoustic waves and its transverse, respectively, are chosen to satisfy the following relations:

$$a=L/4-d,$$

$$b=(L/2-d)tg\ \Psi,$$

where L is the length of the apodized transducer, and d is the projection of the width d' of the bent part BC of the sum bus bar 3 on the propagation direction of the surface acoustic waves.

The triangle (phase compensator 6) is oriented in such a way that one of its sides is aligned with a side of the shield 7, and its base is in line with the part AB of the sum bus bar 3, parallel to the propagation direction of surface acoustic waves but nearer to the bent part BC of the sum bus bar 3.

A SAW bandpass filter according to the invention operates in the following manner.

An electric signal is fed to the filter input terminals 5, 5' to which sum bus bars 3, 4 of the apodized transducer 2 are connected. Transducer 2 then excites surface acoustic waves which propagate along the piezoelectric substrate 1 in two directions: towards the output transducer 9 (a single-pass or direct-passage valid signal) and away from the output transducer 9. As the surface acoustic waves pass under the finger electrodes 16 (FIG. 2) of the input transducer 2, reflection occurs and those reflected waves, overlapping the direct-passage waves propagating towards the transducer 9 (FIG. 1), cause distortion of the filter amplitude-frequency response. The distortion value depends on the length of the signal passage under inoperative (non-overlapping) zones of the finger electrodes 16 (FIG. 2). The V-shaped sum bus bars 3, 4 make it possible to reduce considerably the length of the inoperative zones of the finger electrodes (shown by dashed lines in FIG. 2).

However, so long as the speed of the SAW propagation in the zones of the conductive coating (metallization) and the free surface of piezoelectric substrate 1 (FIG. 1) varies, the wave, as it propagates from region I—I, where there is metallization practically over all the wave front, up to region II—II, where there is no metallization, acquires further distortion of its wavefront. The phase compensator 6 compensates for this distortion. The shape and dimension of the phase compensator are choses to compensate for the absent metallization in each longitudinal wave-propagation channel over the area between regions I—I and II—II. As a result, the wave comes to the transducer 9 (from region III—III) with the original-shaped wavefront without distortions.

Let us consider this in some detail. In view of the bent parts of the sum bus bars 3 and 4, the zones of inoperative electrodes consist of two equal zones. Consequently, the absence of metallization in the line of horizontal section AB of sum bus bar 3 will be equal to:

$$\tfrac{1}{2}ED-BE=L/4-d=a.$$

There is no absent about metallization in the longitudinal channel at the level of the end C of the bent part BC of sum bus bar 3. Therefore height "b" of a phase compensator can be defined as:

$$b=DC=(L/2-d)tg\Psi.$$

Owing to the use of the apodized transducer 2 with a sloping structure of apodization, the minimum SAW reflection from the operating zone of the finger electrodes is ensured, since the path of a valid signal passage has been considerably reduced in each longitudinal channel from the active zone 15 (FIG. 2) during SAW propagation along transducer 2.

At the same time, owing to the fact that the finger electrodes 16 connected to sum bus bars 3, 4 of reversed polarity are practically of the same length due the slope of the sum bus bar 3 in the area between regions I—I and II—II, the filter, according to the invention, features a high level of symmetry along the direct passage of a signal during the polarity reversal of the apodized transducer 2 connection.

A SAW bandpass filter according to the invention can be used in acoustic and electronic devices for frequency and time-domain processing of signals on surface acoustic waves, specifically, stationary and portable T.V. sets and video tape recorders, and among the models with symmetrical selector output and symmetrical grading at the filter outlet.

We claim:

1. A surface acoustic wave bandpass filter comprising:

a piezoelectric substrate for propagation of electroacoustic waves in a direction along a longitudinal axis of said substrate;

an input apodized electroacoustic transducer on a surface of said substrate, said transducer having a tilted apodization structure;

an output unapodized electroacoustic transducer spaced from said apodized transducer on said surface of said substrate;

a phase compensator and a shield, which are metal film areas disposed on said surface of said substrate between said apodized and unapodized transducers;

said apodized transducer having a length L in said direction of propagation of said acoustic waves and including a first summing bus, which is a metal strip on said surface of said substrate, said strip having a width d' and being connected to a first plurality of parallel electrode fingers;

a second summing bus, which is a metal strip on said surface of said substrate, said strip having also a width d' and being connected to a second plurality of electrode fingers directed oppositely and in parallel to said first electrode fingers and defining together therewith a zone of overlapping of said first and second electrode fingers, the contour thereof being a boundary of apodization;

said boundary of apodization being symmetrical relative to a tilted line extending along a diagonal of said input apodized transducer;

said first summing bus being V-shaped and consisting of a first part arranged in parallel to said direction of propagation of said acoustic waves and a second part aligned at an angle $\Psi$ with respect to said first part so that this bar extends along said boundary of apodization as near as possible thereto on one side thereof with respect to said tilted line;

said second summing bus being V-shaped like said first summing bus and consisting of a first part arranged in parallel to said direction of propagation of said acoustic waves and a second part aligned at said angle $\Psi$ with respect to said first part, said second summing bus being disposed symmetrically to said first summing bus relative to said tilted line so that said second summing bus extends along said boundary of apodization as near as possible thereto on an opposite side with respect to said tilted line;

said phase compensator being shaped as a triangle having a base "a" and a height "b" and disposed on said substrate so that its base is at the level of said first part of said first summing bus and so that said second part of said first summing bus is nearer to said phase compensator than said first part thereof, values of said base "a" and said height "b" being selected to conform to the relationships $a = L/4 - d$ and $b = (L/2 - d) \operatorname{tg} \Psi$, where d is the projection of said width d' of said second part of said first summing bus bar on said direction of propagation of said acoustic waves.

\* \* \* \* \*